(12) United States Patent
Bokatius

(10) Patent No.: US 7,142,058 B2
(45) Date of Patent: Nov. 28, 2006

(54) ON-CHIP TEMPERATURE COMPENSATION CIRCUIT FOR AN ELECTRONIC DEVICE

(75) Inventor: Mario M. Bokatius, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 151 days.

(21) Appl. No.: 10/984,438

(22) Filed: Nov. 9, 2004

(65) Prior Publication Data

US 2006/0097790 A1    May 11, 2006

(51) Int. Cl.
*H03F 3/04* (2006.01)
(52) U.S. Cl. ............... 330/289; 330/291; 330/307
(58) Field of Classification Search ............. 330/289, 330/291, 307
See application file for complete search history.

(56) References Cited

U.S. PATENT DOCUMENTS

| | | | |
|---|---|---|---|
| 4,042,886 A * | 8/1977 | Hanna ........................ 330/256 |
| 4,497,586 A * | 2/1985 | Nelson ........................ 374/163 |
| 5,796,291 A * | 8/1998 | Mattes et al. ............... 327/513 |
| 5,859,568 A | 1/1999 | Le et al. |
| 6,603,110 B1 * | 8/2003 | Hayami et al. ......... 250/214 R |
| 6,611,172 B1 | 8/2003 | Kobayashi et al. |
| 6,724,202 B1 * | 4/2004 | Tanizawa .................... 324/725 |

* cited by examiner

*Primary Examiner*—Patricia Nguyen
(74) *Attorney, Agent, or Firm*—Ingrassia, Fisher&Lorenz

(57) ABSTRACT

A general purpose Darlington pair amplifier circuit, configured in accordance with a preferred embodiment of the invention, utilizes GaAs heterojunction bipolar transistor technology. The amplifier circuit incorporates a temperature compensation circuit at the input stage that controls the total current drawn by the transistors such that the total current is stable over temperature. The temperature compensation circuit includes a feedback resistance element and a bias resistance element that form a voltage divider that establishes the base voltage (bias voltage) of an input transistor. The feedback resistance element and the bias resistance element are of different types, having different positive temperature coefficients. In the example embodiment, the temperature coefficient of the feedback resistance element is greater than the temperature coefficient of the bias resistance element. The difference in the temperature coefficients compensates for the negative temperature coefficient of the base-emitter turn-on voltage of the transistors employed by the amplifier circuit.

20 Claims, 3 Drawing Sheets

ON-CHIP TEMPERATURE COMPENSATION CIRCUIT FOR AN ELECTRONIC DEVICE

TECHNICAL FIELD

The present invention relates generally to electronic circuits. More particularly, the present invention relates to a temperature compensation circuit for a heterojunction bipolar transistor amplifier circuit.

BACKGROUND

Traditionally, general purpose amplifiers based on the Darlington pair feedback topology exhibit a large temperature variation of the total current drawn from the power supply. The base-emitter turn-on voltage of a GaAs heterojunction bipolar transistor ("HBT") has a negative temperature coefficient, i.e., as temperature decreases the required switching voltage increases, and vice versa. Thus, if the base or bias voltage is maintained constant while temperature varies (which occurs in conventional designs), then the current drawn by the amplifier will vary with the temperature variation. At higher temperatures the total current draw increases, while at lower temperatures the total current draw decreases. This phenomenon results in a variation of the total current draw, amplifier gain, power, and linearity. Indeed, at very low temperatures the total current draw might decrease to a point where the transistor devices turn off.

A constant bias point over temperature is desired to ensure performance parameters such as gain, power, and linearity are not degraded when the amplifier device is operated at temperatures that vary from room temperature. Traditionally, temperature variation in HBT Darlington pair amplifier circuits is controlled by the use of on-chip collector resistors in the radio frequency ("RF") output path and/or off-chip collector resistors in the DC power supply path. The former requires the use of a larger active transistor area to account for the output power lost in the output path resistors (larger active area also requires higher current requirements). The latter solution requires operation from a higher voltage supply and decreases efficiency due to the power dissipated in the resistors. Both of these conventional solutions may be undesirable in practical applications having a limited power supply voltage and/or strict RF output power requirements.

Accordingly, it is desirable to have an on-chip temperature compensation circuit for use with a general purpose amplifier circuit, such as a GaAs HBT Darlington pair amplifier circuit. In addition, it is desirable to have an on-chip temperature compensation circuit that takes advantage of existing semiconductor fabrication processes. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or electronic elements represented by block components. It should be appreciated that such block components may be realized by any number of practical semiconductor or other circuit elements. In addition, those skilled in the art will appreciate that the present invention may be practiced in conjunction with any number of practical electronic circuit deployments and that the circuits described herein are merely example applications for the invention.

For the sake of brevity, conventional techniques and features related to semiconductor fabrication, semiconductor device technology, circuit design and implementation, and other functional aspects of circuits (and the individual operating components of circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). As used herein, a "port" means a node that is externally accessible via, for example, a physical connector, an input or output pin, a test probe, a bonding pad, or the like.

Figure 2:
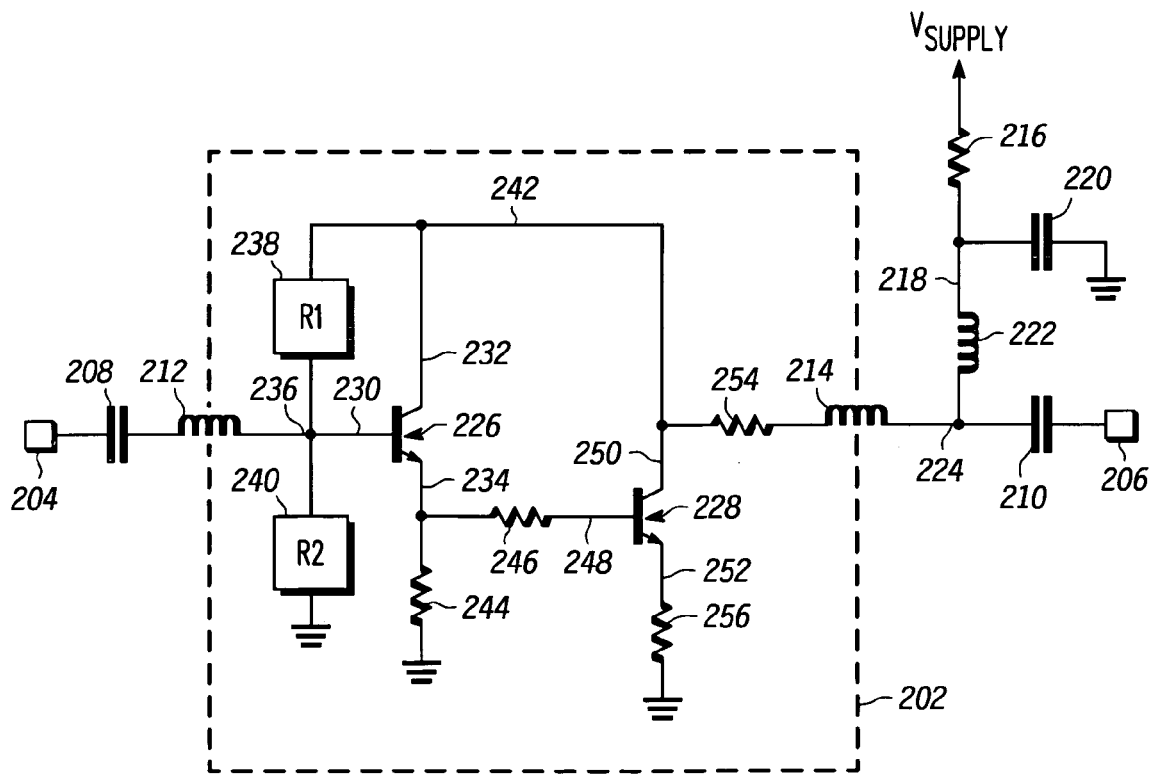
FIG. 2 is a schematic circuit diagram of an electronic circuit package according to an example embodiment of the invention.

The following description refers to nodes or features being "connected" or "coupled" together. As used herein, unless expressly stated otherwise, "connected" means that one node/feature is directly or indirectly connected to another node/feature, and not necessarily mechanically. Likewise, unless expressly stated otherwise, "coupled" means that one node/feature is directly or indirectly coupled to another node/feature, and not necessarily mechanically. Thus, although the schematic shown in FIG. 2 depicts one example arrangement of elements, additional intervening elements, devices, features, or components may be present in an actual embodiment (assuming that the functionality of the circuit is not adversely affected).

Figure 1:
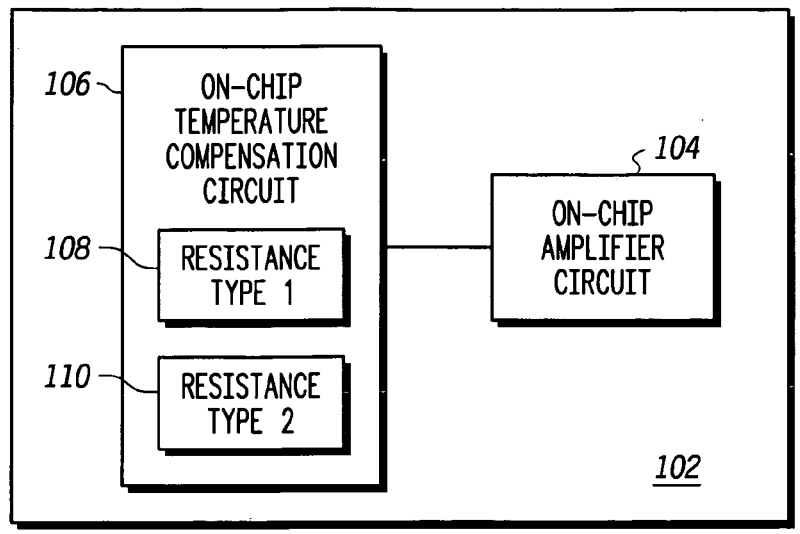
FIG. 1 is a schematic representation of an electronic circuit according to an example embodiment of the invention.

FIG. 1 is a schematic representation of an electronic circuit 100 configured in accordance with the invention. Electronic circuit 100 generally includes a semiconductor substrate 102, an on-chip amplifier circuit 104 formed on semiconductor substrate 102, and an on-chip temperature compensation circuit 106 formed on semiconductor substrate 102. As used herein, "on-chip" refers to components, elements, or features that are formed on a common semiconductor substrate and are fabricated using the same semiconductor manufacturing process. In a practical embodiment, a number of different materials known to those skilled in the art may be used for semiconductor substrate 102, such as materials based upon gallium-arsenide, silicon, gallium-nitride, silicon-germanium, or the like. In the example embodiment, however, semiconductor substrate 102 is a gallium-arsenide ("GaAs") based material, and electronic circuit 100 may be manufactured in accordance with any well known or proprietary process technology.

Amplifier circuit 104 is coupled to temperature compensation circuit 106 and, in a practical embodiment, amplifier circuit 104 may share components or features with temperature compensation circuit 106. Although not shown in FIG. 1, amplifier circuit 104 includes one or more transistor devices, such as HBT devices. Temperature compensation circuit 106 is configured to account for the temperature dependence of the base-emitter turn-on voltage of the transistor devices utilized by amplifier circuit 104. Briefly, temperature compensation circuit 106 varies the base voltages of the transistor devices as temperature varies to maintain a substantially constant bias point and a substantially constant total current draw. Temperature compensation circuit 106 may include a first resistance element 108 of a first type and a second resistance element 110 of a second type that is different than the first type. In the example embodiment, first resistance element 108 and second resistance element 110 form at least a portion of a bias circuit for amplifier circuit 104.

As used herein, the resistance or resistor "type" refers to the manner in which the resistance or resistor is actually realized on semiconductor substrate 102 or the structural form of the resistance or resistor. For example, an on-chip resistor for a GaAs HBT process may be realized in one of several different forms, including, without limitation: a thin film resistor; a base-epi resistor; or a sub-collector-epi resistor. The on-chip resistance elements are fabricated as part of the manufacturing process of electronic circuit 100 itself—the on-chip resistance elements are formed during the manufacture of amplifier circuit 104. Each of these forms represents a different type, and the different resistor types have different operating characteristics. Notably, each resistor type has a different resistivity and a different temperature coefficient. In practice, each of the resistor types identified above has a different positive temperature coefficient, i.e., as temperature increases, the resistance increases, and vice versa. A higher temperature coefficient indicates that the resistance will vary more with changes in temperature. Conversely, a lower temperature coefficient indicates that the resistance will be more stable over temperature.

FIG. 2 is a schematic diagram of an electronic circuit package 200 configured in accordance with an example embodiment of the invention. Electronic circuit package 200 includes a number of on-chip elements formed on a semiconductor substrate 202, e.g., a GaAs substrate, and a number of off-chip elements that may be located on a circuit board or elsewhere remote from semiconductor substrate 202. The on-chip elements shown in FIG. 2 represent one practical implementation of electronic circuit 100 shown in FIG. 1. It should be appreciated that a practical embodiment of electronic circuit package 200 may employ transistors that are actually comprised of multiple parallel transistors. In addition, a practical embodiment may incorporate any number of parallel connected sub-circuits, where each sub-circuit resembles electronic circuit package 200 (or a portion thereof). The scope of the invention described herein is intended to include such practical implementations.

Electronic circuit package 200 includes an RF input node 204 and an RF output node 206. These nodes may be realized as suitable RF connection points, bond pads, connectors, or the like. In a practical embodiment, electronic circuit package 200 corresponds to a general purpose amplifier having 50 ohm input and output impedances and broadband operation that supports RF signals ranging between approximately 2 MHz to approximately 6 GHz. RF input node 204 may be coupled to one or more on-chip components via a DC blocking capacitor 208, and RF output node 206 may be coupled to one or more on-chip components via a DC blocking capacitor 210. In practice, a wire bond connecting capacitor 208 to the on-chip components can be treated as an inductor 212, and a wire bond connecting capacitor 210 to the on-chip components can be treated as an inductor 214. In this regard, inductors 212/214 are depicted as elements straddling the border between on-chip and off-chip components.

Electronic circuit package 200 may receive operating voltage from an off-chip power supply (identified as $V_{SUPPLY}$ in FIG. 2). Although not a requirement of the invention, many practical applications employ a five volt DC power supply. The node corresponding to the power supply is coupled to one end of a compensation resistor 216. The other end of resistor 216 is connected to a node 218. Ideally, the resistance of resistor 216 is zero ohms to eliminate any voltage drop from the power supply, however, in a practical embodiment, a small resistance may be utilized to enhance the thermal stability of electronic circuit package 200. For example, resistor 216 may have a resistance between approximately 0 ohms and approximately 100 ohms in a practical implementation.

Electronic circuit package 200 may also include one or more bypass capacitors 220 connected between node 218 and an off-chip ground. Bypass capacitor 220 may be employed to substantially provide a short circuit for baseband frequency components. In a practical implementation, bypass capacitor 220 may have a capacitance between approximately 20 pF to approximately 1 µF. Electronic circuit package 200 may also include an inductor 222 connected between node 218 and a node 224, to which capacitor 210 and inductor 214 are also connected. Inductor 222 functions as an RF choke for electronic circuit package 200. In a practical embodiment, inductor 222 may have an inductance of approximately 10 nH to approximately 500 nH.

The on-chip components of electronic circuit package 200 form a Darlington pair amplifier that includes two HBT transistors (referred to herein as an input transistor 226 and an output transistor 228), each having a base, an emitter, and a collector. The general topology and functionality of the Darlington pair amplifier is well known to those skilled in the art and, therefore, will not be described in detail herein. Transistor 226 includes a base 230, a collector 232, and an emitter 234. The nominal base-emitter voltage drop across transistor 226 is approximately 1.3 volts. Base 230 is coupled to a node 236, which is also coupled to one end of inductor 212. Node 236 is also coupled to one end of a resistance element 238 and to one end of a resistance element 240. Resistance element 238 is coupled between node 236 and a node 242, and resistance element 240 is coupled between node 236 and an on-chip circuit ground. Resistance element 238 functions as a feedback resistance element for transistor 226, and resistance element 240 functions as a bias resistance element for transistor 226. It should be appreciated that resistance elements 238/240 function as a voltage divider to establish the bias voltage for transistor 226. Collector 232 of transistor 226 is also coupled to node 242. Thus, resistance element 238 is coupled between base 230 and collector 232. In the example embodiment, emitter 234 is coupled to an on-chip circuit ground via a resistor 244. Emitter 234 is also coupled to one end of a resistor 246.

Transistor 228 includes a base 248, a collector 250, and an emitter 252. The nominal base-emitter voltage drop across transistor 228 is approximately 1.3 volts. Base 248 may be coupled to emitter 234 of transistor 226 via resistor 246, which may function to improve stability. In this regard, the current drawn by transistor 226, the value of resistor 244, and the value of resistor 246 contribute to establish the bias voltage for transistor 228. Collector 250 is coupled to node 242, i.e., collector 250 of transistor 228 is coupled to collector 232 of transistor 226 and to one end of resistance element 238. Collector 250 is also coupled to inductor 214 via a resistor 254, which may be utilized to further enhance the temperature compensation function. Ideally, however, resistor 254 should be eliminated or the resistance of resistor 254 should be minimized. In the example embodiment, emitter 252 of transistor 228 is coupled to an on-chip circuit ground via a resistor 256.

Resistance element 238, combined with resistance element 240, form at least a portion of a temperature compensation circuit for the Darlington pair feedback amplifier. The temperature compensation feature is preferably realized by forming resistance element 238 as a first resistance type having a first temperature coefficient, and forming resistance element 240 as a second resistance type having a second temperature coefficient. In the example embodiment, transistor 226 has a base-emitter turn-on voltage having a negative temperature coefficient (i.e., as temperature decreases, the required base-emitter switching voltage increases, and vice versa), and the resistance elements 238/240 have positive temperature coefficients (i.e., as temperature decreases, the respective resistances decrease, and vice versa). More specifically, the resistance elements 238/240 have positive linear temperature coefficients. Preferably, the temperature coefficient of first resistance element 238 is greater than the temperature coefficient of second resistance element 240, and the two temperature coefficients differ by an amount that provides temperature compensation for the negative temperature coefficient corresponding to the base-emitter turn-on voltage of transistors 226/228.

The particular configuration of first resistance element 238 and second resistance element 240 may vary from one application to another, depending upon practical design considerations such as, without limitation: intended operating temperature range, power supply voltage, input and output power specifications, physical size constraints, desired gain, linearity, and operating bandwidth. In the preferred embodiment, the on-chip components, including first resistance element 238 and second resistance element 240, are fabricated using the same semiconductor technology and during the same manufacturing process. In practice, first resistance element 238 may comprise any number of thin film resistors, any number of base-epi resistors, any number of sub-collector-epi resistors, any number of resistors that can otherwise be fabricated using the given semiconductor technology, or any parallel and/or series combination thereof. Likewise, second resistance element 240 may comprise any number of thin film resistors, any number of base-epi resistors, any number of sub-collector-epi resistors, any number of resistors that can otherwise be fabricated using the given semiconductor technology, or any parallel and/or series combination thereof. Consequently, the temperature compensation aspect of the combination of first resistance element 238 and second resistance element 240 can be adjusted to suit the thermal characteristics of transistors 226/228 by selecting appropriate resistance types and an appropriate topology of resistor elements. In this manner, if first resistance element 238 and second resistance element 240 are selected to have the proper ratio of temperature coefficients, the temperature dependence of the total current drawn from the power supply can be reduced relative to conventional HBT-based Darlington pair amplifier designs.

In practice, the different resistor types (e.g., thin film, base-epi, and sub-collector-epi) have different sheet resistivities and different linear temperature coefficients. For example, a thin film resistance has a temperature coefficient of approximately 70 ppm/° K., a base-epi resistance has a temperature coefficient of approximately 600 ppm/° K., and a sub-collector-epi resistance has a temperature coefficient of approximately 1730 ppm/° K. In contrast, the base-emitter turn on voltage for a typical GaAs HBT transistor has a temperature coefficient of approximately −0.00133 V/° K. Thus, series and parallel combinations of the different resistor types can be produced to obtain a range of temperature coefficients between the lowest coefficient (e.g., approximately 70 ppm/° K. for thin film resistors) and the highest coefficient (e.g., approximately 1730 ppm/° K. for sub-collector-epi resistors).

As mentioned above, first resistance element 238 is chosen to have a higher temperature coefficient than second resistance element 240. As a result, in response to an increase in temperature, the resistance of resistance element 238 increases relatively more while the resistance of resistance element 240 increases relatively less. Therefore, the voltage across second resistance element 240 will drop with rising temperature and increase with dropping temperature (assuming that the voltage at node 242 remains stable over temperature). In other words, as temperature increases, the bias voltage of input transistor 226 decreases. In this manner, the bias point and resulting current draw of input transistor 226 can be controlled over temperature to compensate for its variation in switching voltage. The bias point of output transistor 228 is dependent upon the bias point of input transistor 226, and dependent upon the voltage drop across resistor 244. Accordingly, if the effective temperature coefficients of first and second resistance elements 238/240 are chosen properly, the variation of total current drawn by the Darlington pair amplifier can be minimized.

The contributions of resistor 244 and resistor 246 are less significant, and the temperature compensation contribution of resistance element 238 and resistance element 240 dominates. Accordingly, the technique described above need not be applied to resistor 244 and resistor 246. In the example embodiment, resistor 244 and resistor 246 are fabricated to be of the same type, and are selected to have the lowest possible temperature coefficient of the available semiconductor resistor types.

The specific nominal values of first resistance element 238 and second resistance element 240 are preferably selected to achieve the desired RF input matching (e.g., 50 ohms) and to provide appropriate biasing of the HBT transistors. The use of different resistor types for first resistance element 238 and second resistance element 240 does not adversely affect input matching because the variation (in ohms) over temperature is insignificant compared to the actual resistance values. One example circuit may have the following nominal component values (the subscript numerals for the components correspond to the reference numbers in FIG. 2):

TABLE 1

Example Component Values

| Component | Value |
|---|---|
| $R_{238}$ | 540 ohms |
| $R_{240}$ | 640 ohms |
| $R_{244}$ | 140 ohms |
| $R_{246}$ | 5 ohms |
| $R_{256}$ | 2 ohms |
| $R_{216}$ | 0 ohms |
| $R_{254}$ | 0 ohms |
| $Q_{226}$ | 50 µm² |
| $Q_{228}$ | 160 µm² |
| $V_{SUPPLY}$ | 5 volts |

In a practical Darlington pair amplifier circuit, input transistor 226 is smaller in size than output transistor 228. In addition, the resistance of resistor 244 will be greater than the resistance of resistor 256 to create a sufficient voltage drop across resistor 244 that accounts for the additional base-emitter voltage drop across output transistor 228. For purposes of this example embodiment, resistance element 238 is a sub-collector-epi resistor, and resistance element 240 is a composite resistance comprising a 440 ohm thin film resistor in series with a 200 ohm base-epi resistor. As mentioned above, the sub-collector-epi resistance element 238 has a temperature coefficient of approximately 1730 ppm/° K. The composite resistance element 240, however, has an effective temperature coefficient of approximately 300 ppm/° K. The effective temperature coefficient results from the cooperative effect of the different resistance types realized in the composite resistance element.

Figure 3:
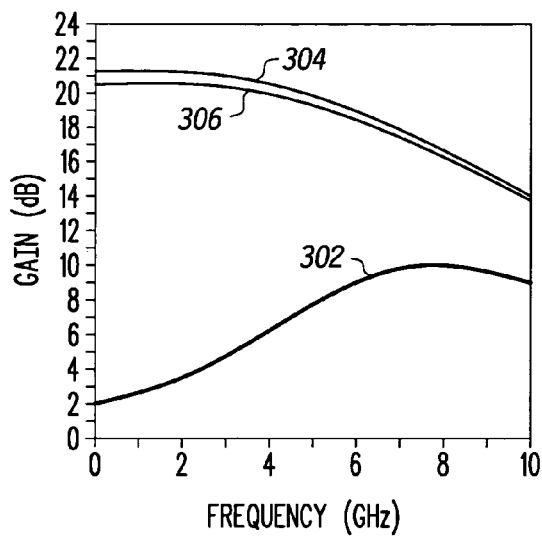
FIG. 3 is a graph showing the variation in power gain versus frequency at different operating temperatures for a prior art amplifier circuit.
Figure 4:
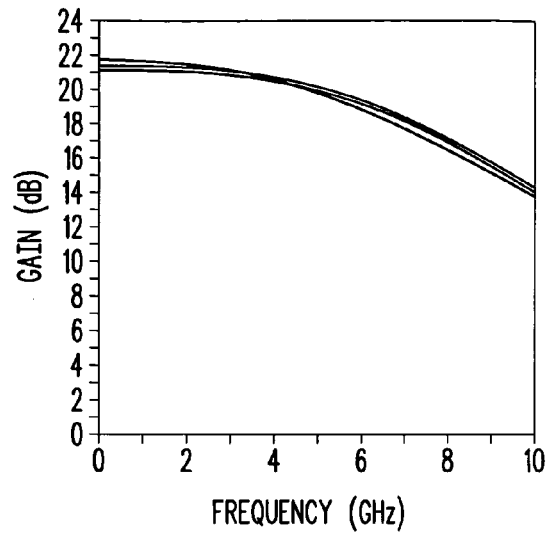
FIG. 4 is a graph showing the variation in power gain versus frequency at different operating temperatures for an amplifier circuit according to an example embodiment of the invention.

FIG. 3 is a graph showing the variation in power gain versus frequency at different operating temperatures for a prior art amplifier circuit having the general topology shown in FIG. 2, and FIG. 4 is a graph showing the variation in output power gain versus frequency at different operating temperatures for an amplifier circuit according to an example embodiment of the invention having the example component values listed in Table 1 and the example temperature coefficients described above. The graph in FIG. 4 was derived using RF circuit simulation software. A first plot 302 in FIG. 3 represents the operating characteristics of the prior art amplifier at negative 40° C., a second plot 304 in FIG. 3 represents the operating characteristics of the prior art amplifier at 25° C., and a third plot 306 in FIG. 3 represents the operating characteristics of the prior art amplifier at 85° C. It should be appreciated that the graph in FIG. 3 represents an extreme case that makes it easy to illustrates the temperature variation characteristics. The difference in power gain at negative 40° C. is clearly noticeable. Furthermore, the power gain at negative 40° C. is significantly nonlinear relative to the power gain at 25° C. and at 85° C. In contrast, the three corresponding plots (for negative 40° C., 25° C., and 85° C.) in FIG. 4 are virtually indistinguishable. FIG. 4 illustrates the effect of the temperature compensation feature described above.

Figure 5:
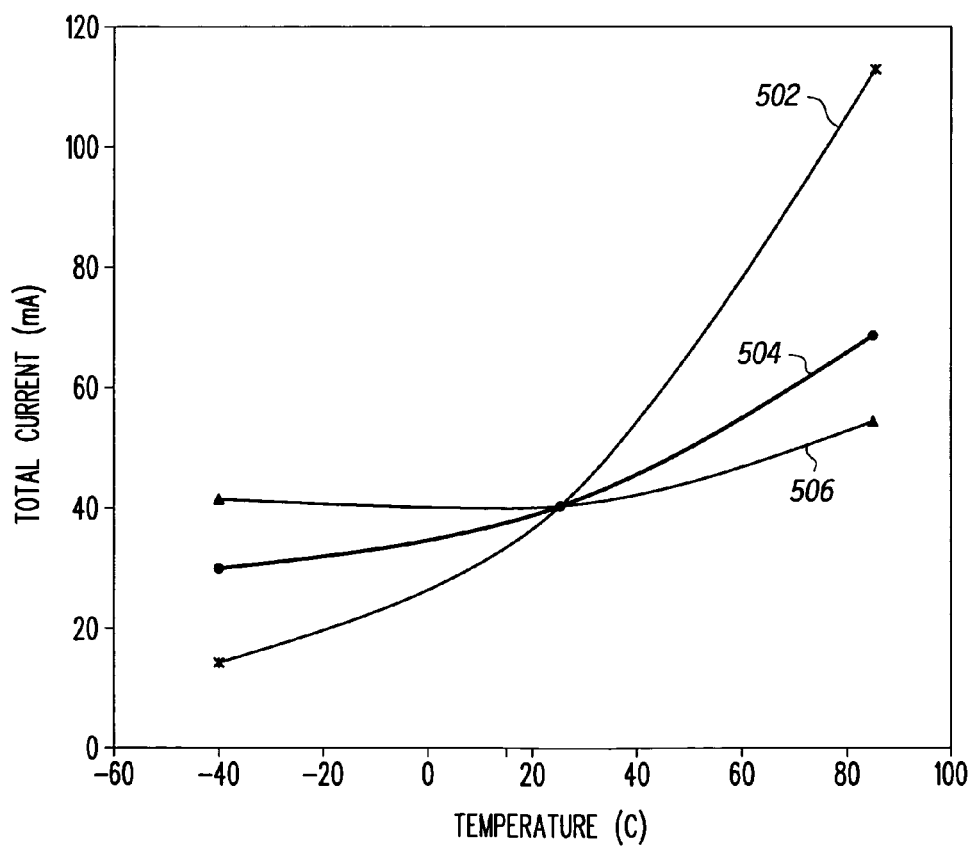
FIG. 5 is a graph showing total current draw versus operating temperature for different on-chip temperature compensation circuit configurations.

FIG. 5 is a graph showing total current draw versus operating temperature for different on-chip temperature compensation circuit configurations for the circuit topology shown in FIG. 2. The graph in FIG. 5 was derived using RF circuit simulation software, assuming the nominal example component values listed in Table 1. A first plot 502 represents the operating characteristics of a prior art amplifier that employs the same resistor type (e.g., sub-collector-epi) for both resistors in the input voltage divider. The increase in total current drawn by the amplifier with increasing temperature is clearly noticeable in first plot 502. Indeed, the variation in total current draw is approximately 100 mA over the illustrated temperature range. FIG. 5 also contains a second plot 504 that represents the operating characteristics of an amplifier configured in accordance with one embodiment of the invention, where first resistance element 238 is a sub-collector-epi resistor and second resistance element 240 is a 640 ohm base-epi resistor. The improvement in performance is noticeable, and the variation in total current draw is only about 30 mA over the illustrated temperature range. FIG. 5 also contains a third plot 506 that represents the operating characteristics of an amplifier configured in accordance with another embodiment of the invention, where first resistance element 238 is a sub-collector-epi resistor and second resistance element 240 is a 640 ohm composite resistance comprising a 200 ohm base-epi resistor in series with a 440 ohm thin film resistor. Third plot 506 indicates a further improvement in performance, and the variation in total current draw is only about 15 mA over the illustrated temperature range. Of course, in a practical embodiment, small resistance values may be utilized for resistor 216 and/or resistor 254 to further enhance the temperature compensation for the amplifier circuit.

Figure 6:
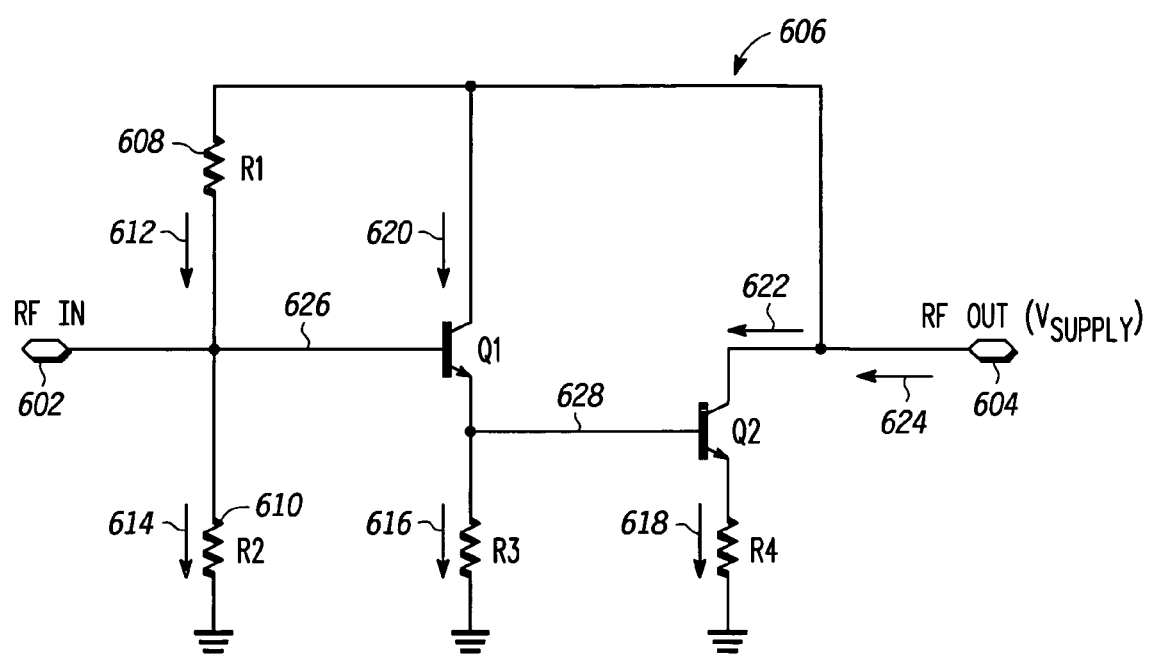
FIG. 6 is a simplified schematic circuit diagram of an electronic circuit package that may be configured in accordance with an example embodiment of the invention.

FIG. 6 is a schematic circuit diagram of an amplifier circuit 600, which may be configured in accordance with an example embodiment of the invention. For ease of illustration and clarity of description, FIG. 6 represents a simplified version of the electronic circuit package topology shown in FIG. 2. In particular, the various input and output conditioning elements and the separate power supply are not depicted in FIG. 6. Rather, FIG. 6 simply depicts an RF input node 602, an RF output node (combined with a power supply voltage node) 604, and a Darlington pair amplifier circuit 606 having a feedback resistance element 608 and a bias resistance element 610. The specific component values are as listed above in Table 1.

FIG. 6 identifies a number of currents that flow in various circuit branches during operation of amplifier circuit 600. In particular, FIG. 6 identifies: an R1 current 612, which flows through feedback resistance element 608; an R2 current 614, which flows through bias resistance element 610; an R3 current 616, which flows through resistance R3; an R4 current 618, which flows through resistance R4; a Q1 current 620, drawn into transistor Q1; a Q2 current 622, drawn into transistor Q2; and a total current 624, drawn from the power supply. FIG. 6 also identifies a base node 626 corresponding to the base of transistor Q1, and a base node 628 corresponding to the base of transistor Q2.

The simulated performance of a Darlington pair amplifier configured in accordance with the example embodiment can be compared to the simulated performance of a conventional Darlington pair amplifier by analyzing the various currents identified in FIG. 6. Table 2 lists currents and voltages at three different operating temperatures for both a conventional amplifier (i.e., one where feedback resistance element 608 and bias resistance element 610 are of the same type having the same temperature coefficient) and an amplifier configured in accordance with the example embodiment (i.e., one where the temperature coefficient of feedback resistance element 608 is greater than the temperature coefficient of bias resistance element 610).

TABLE 2

Simulated Current Draw and Base Voltages

| Circuit | T (° C.) | $I_{612}$ (mA) | $I_{614}$ (mA) | $I_{616}$ (mA) | $I_{618}$ (mA) | $I_{620}$ (mA) | $I_{622}$ (mA) | $I_{624}$ (mA) | $V_{626}$ (V) | $V_{628}$ (V) |
|---|---|---|---|---|---|---|---|---|---|---|
| Conventional | +85 | 3.89 | 3.79 | 9.79 | 98.0 | 10.9 | 96.8 | 112 | 2.68 | 1.41 |
|  | +25 | 4.28 | 4.20 | 9.74 | 26.9 | 9.88 | 26.6 | 40.8 | 2.69 | 1.36 |
|  | −40 | 4.81 | 4.74 | 9.71 | 0.3 | 9.64 | 0.3 | 14.7 | 2.69 | 1.31 |
| Example Embodiment | +85 | 4.06 | 3.97 | 9.12 | 39.9 | 9.42 | 39.9 | 53.0 | 2.58 | 1.32 |
|  | +25 | 4.28 | 4.20 | 9.74 | 26.9 | 9.88 | 26.6 | 40.8 | 2.69 | 1.36 |
|  | −40 | 4.55 | 4.47 | 10.6 | 28.4 | 10.7 | 28.3 | 43.5 | 2.82 | 1.43 |

Referring to the performance of the conventional circuit, the stability of $V_{626}$ (the bias voltage of transistor Q1) over temperature is apparent. The stability of $V_{626}$ causes a variation in $I_{620}$ (the current drawn by transistor Q1) and a variation in $I_{616}$ because the base-emitter turn-on voltage of transistor Q1 fluctuates over temperature. The variation of $I_{616}$, along with the temperature variation in the actual resistance of resistor R3, causes variation in $V_{628}$ (the bias voltage of transistor Q2). Notably, $V_{628}$ increases with increasing temperature, which exacerbates the temperature dependence of $I_{624}$ (the total current draw of the circuit). Table 2 shows the undesirable trend in $I_{624}$, which varies significantly over the example temperature range.

Referring to the performance of the example embodiment, the different resistance types utilized for feedback resistance element 608 and bias resistance element 610 result in a variation in $V_{626}$ over temperature. This variation in $V_{626}$ compensates for the temperature coefficient of transistor Q1 and for the temperature coefficient of transistor Q2. In a practical embodiment, feedback resistance element 608 and bias resistance element 610 are suitably configured to overcompensate for the temperature coefficient of transistor Q1 such that the bias point of Q2 can be stabilized over temperature. In other words, the temperature compensation circuit is suitably configured such that the resultant temperature variation in $V_{628}$ compensates for the temperature coefficient of transistor Q2. Ideally, the temperature compensation circuit is configured such that the total current draw, $I_{624}$ is stable over the desired temperature range. Of course, in a practical embodiment, $I_{624}$ may vary slightly over temperature, as shown in the simulated results in Table 2.

In the example embodiment, the base voltages for both transistors are inversely proportional to temperature. This trend allows the transistor bias points to be maintained over temperature. In contrast, the base voltage for transistor Q2 in the conventional circuit is proportional to temperature, resulting in a fluctuating bias point for transistor Q2. In practice, transistor Q2 is more susceptible to temperature variation relative to transistor Q1 because transistor Q2 draws significantly more current than transistor Q1. Consequently, it is important to carefully control the operation of transistor Q2 in practical embodiments. A temperature compensation circuit configured in accordance with the example embodiment of invention achieves this goal.

While at least one example embodiment has been presented in the foregoing detailed description, it should be appreciated that a vast number of variations exist. It should also be appreciated that the illustrated embodiment is only an example, and is not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electronic amplifier circuit comprising:
   a semiconductor substrate;
   a heterojunction bipolar transistor ("HBT") formed on said semiconductor substrate, said HBT having a base, an emitter, and a collector;
   a feedback resistance element formed on said semiconductor substrate and coupled between said collector and said base, said feedback resistance element having a first temperature coefficient; and
   a bias resistance element formed on said semiconductor substrate and coupled between said base and a circuit ground, said bias resistance element having a second temperature coefficient that is less than said first temperature coefficient.

2. An electronic amplifier circuit according to claim 1, wherein:
   said HBT has a base-emitter turn-on voltage having a negative temperature coefficient; and
   said first temperature coefficient and said second temperature coefficient differ by an amount that provides temperature compensation for said negative temperature coefficient.

3. An electronic amplifier circuit according to claim 2, wherein:
   said first temperature coefficient is positive; and
   said second temperature coefficient is positive.

4. An electronic amplifier circuit according to claim 1, wherein said feedback resistance element comprises a thin film resistor.

5. An electronic amplifier circuit according to claim 1, wherein said feedback resistance element comprises a base-epi resistor.

6. An electronic amplifier circuit according to claim 1, wherein said feedback resistance element comprises a sub-collector-epi resistor.

7. An electronic amplifier circuit according to claim 1, wherein said bias resistance element comprises a thin film resistor.

8. An electronic amplifier circuit according to claim 1, wherein said bias resistance element comprises a base-epi resistor.

9. An electronic amplifier circuit according to claim 1, wherein said bias resistance element comprises a sub-collector-epi resistor.

10. An electronic amplifier circuit according to claim 1, wherein said semiconductor substrate comprises GaAs.

11. An electronic amplifier circuit comprising:
a semiconductor substrate;
a Darlington pair feedback amplifier formed on said semiconductor substrate; and
a temperature compensation circuit formed on said semiconductor substrate and coupled to said Darlington pair feedback amplifier, said temperature compensation circuit comprising a feedback resistance element of a first type and a bias resistance element of a second type.

12. An electronic amplifier circuit according to claim 11, said feedback resistance element having a first temperature coefficient and said bias resistance element having a second temperature coefficient that is less than said first temperature coefficient.

13. An electronic amplifier circuit according to claim 11, wherein:
said Darlington pair feedback amplifier comprises an input heterojunction bipolar transistor ("HBT") formed on said semiconductor substrate; and
said temperature compensation circuit is coupled to said input HBT.

14. An electronic amplifier circuit according to claim 13, wherein:
said input HBT has a base, an emitter, and a collector;
said feedback resistance element is coupled between said collector and said base; and
said bias resistance element is coupled between said base and a circuit ground.

15. An electronic amplifier circuit according to claim 14, wherein:
said input HBT has a base-emitter turn-on voltage having a negative temperature coefficient;
said feedback resistance element has a first temperature coefficient;
said bias resistance element has a second temperature coefficient; and
said first temperature coefficient and said second temperature coefficient differ by an amount that provides temperature compensation for said negative temperature coefficient.

16. An electronic amplifier circuit according to claim 15, wherein:
said first temperature coefficient is positive; and
said second temperature coefficient is positive.

17. An electronic amplifier circuit according to claim 11, wherein said semiconductor substrate comprises GaAs.

18. An electronic amplifier circuit comprising:
a GaAs substrate;
an input heterojunction bipolar transistor ("HBT") formed on said GaAs substrate, said input HBT having a base, an emitter, and a collector;
a temperature compensation circuit formed on said GaAs substrate and coupled to said input HBT, said temperature compensation circuit comprising:
a feedback resistance element coupled between said collector and said base, said feedback resistance element having a first temperature coefficient; and
a bias resistance element coupled between said base and a circuit ground, said bias resistance element having a second temperature coefficient that is less than said first temperature coefficient.

19. An electronic amplifier circuit according to claim 18, further comprising an output HBT formed on said GaAs substrate, said output HBT having a base coupled to said emitter of said input HBT, an emitter, and a collector coupled to said collector of said input HBT.

20. An electronic amplifier circuit according to claim 19, wherein said first temperature coefficient and said second temperature coefficient differ by an amount that provides temperature compensation for current drawn by said output HBT.

* * * * *